(12) United States Patent
Watanabe et al.

(10) Patent No.: US 11,158,554 B2
(45) Date of Patent: Oct. 26, 2021

(54) SHIELDED FAN-OUT PACKAGED SEMICONDUCTOR DEVICE AND METHOD OF MANUFACTURING

(71) Applicant: Micron Technology, Inc., Boise, ID (US)

(72) Inventors: Fumitomo Watanabe, Akita (JP); Keiyo Kusanagi, Akita (JP)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/657,798

(22) Filed: Oct. 18, 2019

(65) Prior Publication Data

US 2020/0051882 A1 Feb. 13, 2020

Related U.S. Application Data

(63) Continuation of application No. 15/662,769, filed on Jul. 28, 2017, now Pat. No. 10,453,762.

(51) Int. Cl.

| H01L 23/60 | (2006.01) |
| H01L 23/552 | (2006.01) |
| H01L 23/31 | (2006.01) |
| H01L 21/56 | (2006.01) |
| H01L 23/00 | (2006.01) |

(Continued)

(52) U.S. Cl.
CPC ........ H01L 23/3107 (2013.01); H01L 21/561 (2013.01); H01L 21/568 (2013.01);
(Continued)

(58) Field of Classification Search
CPC ... H01L 23/60; H01L 23/3017; H01L 21/561; H01L 21/568; H01L 21/6835;
(Continued)

(56) References Cited

U.S. PATENT DOCUMENTS 9,818,734 B2 * 11/2017 Lin .................... H01L 23/49811
2008/0128890 A1 6/2008 Choi et al.
(Continued)

FOREIGN PATENT DOCUMENTS

| CN | 101188226 A | 5/2008 |
| CN | 101919053 A | 12/2010 |
| CN | 102315200 A | 1/2012 |

OTHER PUBLICATIONS

International Application No. PCT/US2018/039824—International Search Report and Written Opinion, dated Oct. 26, 2018, 15 pages.
(Continued)

*Primary Examiner* — David Vu
*Assistant Examiner* — Brandon C Fox
(74) *Attorney, Agent, or Firm* — Perkins Coie LLP (57) ABSTRACT

Several aspects of the present technology are directed toward fan-out packaged semiconductor devices having an integrated shield to protect against electromagnetic interference and methods of manufacturing such devices. The shield can be constructed by forming a conductive wall on a redistribution structure and disposing a conductive cap on an upper surface of an encapsulant. The conductive wall and the conductive cap are electrically connected to each other. By forming the conductive wall directly on the redistribution structure and separately disposing the conductive cap onto an upper surface of the encapsulant, an electromagnetic shield can be readily formed using wafer-level or panel-level processing techniques that are efficient and cost-effective. Several embodiments of semiconductor devices in accordance with the present technology accordingly shield the integrated circuitry of semiconductor dies from electromagnetic interference.

16 Claims, 7 Drawing Sheets

(51) Int. Cl.
　　　*H01L 21/683*　　(2006.01)
　　　*H01L 25/065*　　(2006.01)

(52) U.S. Cl.
　　　CPC ...... *H01L 21/6835* (2013.01); *H01L 23/3114* (2013.01); *H01L 23/3171* (2013.01); *H01L 23/3185* (2013.01); *H01L 23/552* (2013.01); *H01L 23/60* (2013.01); *H01L 24/19* (2013.01); *H01L 23/3128* (2013.01); *H01L 24/16* (2013.01); *H01L 24/32* (2013.01); *H01L 24/73* (2013.01); *H01L 24/81* (2013.01); *H01L 24/92* (2013.01); *H01L 25/0655* (2013.01); *H01L 2221/68345* (2013.01); *H01L 2221/68359* (2013.01); *H01L 2224/0401* (2013.01); *H01L 2224/16227* (2013.01); *H01L 2224/32225* (2013.01); *H01L 2224/73204* (2013.01); *H01L 2224/81005* (2013.01); *H01L 2224/92125* (2013.01); *H01L 2224/97* (2013.01); *H01L 2924/014* (2013.01); *H01L 2924/01015* (2013.01); *H01L 2924/01082* (2013.01); *H01L 2924/14* (2013.01); *H01L 2924/1431* (2013.01); *H01L 2924/1434* (2013.01); *H01L 2924/15192* (2013.01); *H01L 2924/15311* (2013.01); *H01L 2924/15331* (2013.01); *H01L 2924/3025* (2013.01)

(58) Field of Classification Search
　　　CPC ............. H01L 23/3114; H01L 23/3171; H01L 23/3185; H01L 23/552; H01L 24/19
　　　USPC .................................................. 257/659, 660
　　　See application file for complete search history.

(56) References Cited

U.S. PATENT DOCUMENTS

| | | |
|---|---|---|
| 2009/0284947 A1 | 11/2009 | Beddingfield et al. |
| 2010/0244208 A1 | 9/2010 | Pagaila et al. |
| 2010/0276792 A1 | 11/2010 | Chi et al. |
| 2011/0298101 A1 | 12/2011 | Pagaila et al. |
| 2011/0298105 A1 | 12/2011 | Chi et al. |
| 2011/0298109 A1* | 12/2011 | Pagaila ............... H01L 24/97 257/660 |
| 2012/0062439 A1 | 3/2012 | Liao et al. |
| 2012/0286407 A1* | 11/2012 | Choi ................ H01L 23/49827 257/670 |
| 2013/0082364 A1 | 4/2013 | Wang et al. |
| 2014/0021591 A1 | 1/2014 | Sung et al. |
| 2014/0124906 A1* | 5/2014 | Park ...................... H01L 23/552 257/659 |
| 2015/0108621 A1* | 4/2015 | Pabst ................. H01L 21/568 257/659 |
| 2016/0148882 A1 | 5/2016 | Kim et al. |
| 2016/0260695 A1* | 9/2016 | Chung ................. H01L 25/18 |
| 2017/0040266 A1 | 2/2017 | Lin et al. |
| 2017/0047293 A1* | 2/2017 | Moon .................. H01L 23/544 |
| 2017/0295679 A1 | 10/2017 | Kim et al. |
| 2018/0197821 A1 | 7/2018 | Shin et al. |
| 2019/0035706 A1 | 1/2019 | Watanabe et al. |

OTHER PUBLICATIONS

TW Patent Application No. 107123875—Taiwanese Office Action and Search Report, dated Jul. 30, 2019, with English translation, 16 pages.
TW Patent Application No. 107123875—Taiwanese Office Action, dated Nov. 11, 2019, with English translation, 18 pages.
CN Patent Application No. 201880033776.X—Chinese Office Action, dated May 11, 2020, with English translation, 12 pages.
CN Patent Application No. 201880033776.X—Chinese Office Action and Search Report, dated Jun. 2, 2021, with English translation, 12 pages.

* cited by examiner

SHIELDED FAN-OUT PACKAGED SEMICONDUCTOR DEVICE AND METHOD OF MANUFACTURING

CROSS-REFERENCE TO RELATED APPLICATION(S)

This application is a continuation of U.S. application Ser. No. 15/662,769, filed Jul. 28, 2017; which is incorporated herein by reference in its entirety.

TECHNICAL FIELD

The present technology is generally directed to semiconductor devices. In particular, several embodiments of the present technology are directed toward fan-out packaged semiconductor devices having an integrated shield to protect against electromagnetic interference and methods of manufacturing such devices.

BACKGROUND

Microelectronic devices generally have a semiconductor die (i.e., a chip) that includes integrated circuitry with a high density of very small components. Typically, dies include an array of very small bond pads electrically coupled to the integrated circuitry. The bond pads are external electrical contacts through which the supply voltage, signals, etc., are transmitted to and from the integrated circuitry. After dies are formed, they are "packaged" to couple the bond pads to a larger array of electrical terminals that can be more easily coupled to the various power supply lines, signal lines, and ground lines. Conventional processes for packaging dies include electrically coupling the bond pads on the dies to an array of leads, ball pads, or other types of electrical terminals of an interposer substrate. The dies are then encapsulated to protect them from environmental factors (e.g., moisture, particulates, static electricity, and physical impact).

Different types of semiconductor dies may have widely different bond pad arrangements and yet should be compatible with similar external devices. Accordingly, existing packaging techniques can include attaching a redistribution layer to a semiconductor die. The redistribution layer includes lines and/or vias that connect the bond pads of the die with bond pads of the redistribution layer. The redistribution layer includes an array of leads, ball-pads, or other types of electrical terminals arranged to mate with the electrical terminals of external devices.

One challenge is that electromagnetic interference can impair the operation of high-performance semiconductor devices. As a result, it may be desirable to shield the integrated circuitry of a semiconductor die from electromagnetic interference. However, pre-formed copper lids and other forms of external shielding are costly and can be impractical. Similarly, pre-formed copper shields that are fully embedded within an encapsulant are also costly to incorporate into the packaging of semiconductor devices.

BRIEF DESCRIPTION OF THE DRAWINGS

Many aspects of the present technology can be better understood with reference to the following drawings. The components in the drawings are not necessarily to scale. Instead, emphasis is placed on illustrating clearly the principles of the present technology.

For ease of reference, throughout this disclosure identical reference numbers are used to identify similar or analogous components or features, but the use of the same reference number does not imply that the parts should be construed to be identical. Indeed, in many examples described herein, the identically-numbered parts are distinct in structure and/or function. Furthermore, the same shading may be used to indicate materials in a cross section that can be compositionally similar, but the use of the same shading does not imply that the materials should be construed to be identical.

Additionally, in the following description numerous specific details are discussed to provide a thorough and enabling description for embodiments of the present technology. One skilled in the relevant art, however, will recognize that the disclosure can be practiced without one or more of the specific details. In other instances, well-known structures or operations often associated with semiconductor devices are not shown, or are not described in detail, to avoid obscuring other aspects of the technology. In general, it should be understood that various other devices, systems, and methods in addition to those specific embodiments disclosed herein may be within the scope of the present technology.

As used herein, the terms "vertical," "lateral," "upper," and "lower" can refer to relative directions or positions of features in the semiconductor die assemblies in view of the orientation shown in the Figures. For example, "upper" or "uppermost" can refer to a feature positioned closer to the top of a page than another feature. These terms, however, should be construed broadly to include semiconductor devices having other orientations, such as inverted or inclined orientations where top/bottom, over/under, above/below, up/down, and left/right can be interchanged depending on the orientation.

DETAILED DESCRIPTION

Specific details of several embodiments of semiconductor devices are described below. One aspect of several embodiments of the present technology is that a shield structure is constructed by forming a conductive wall on a redistribution structure and disposing a conductive cap on an upper surface of an encapsulant. The conductive wall and the conductive cap are electrically connected to each other. By forming the conductive wall directly on the redistribution structure and separately disposing the conductive cap onto an upper surface of the encapsulant, an electromagnetic shield can be readily formed using wafer-level or panel-level processing techniques that are efficient and cost-effective. Several embodiments of semiconductor devices in accordance with the present technology accordingly shield the integrated circuitry of semiconductor dies from electromagnetic interference.

Packaged semiconductor devices in accordance with several embodiments of the present technology include a redistribution structure and a semiconductor die. The redistribution structure has a first side, a second side, and a dielectric formation having a thickness from the first side to the second side. The redistribution structure can also include die contacts at the first side, at least one shield contact at the first side, and ball pads at the second side. The semiconductor die is mounted to the first side of the redistribution structure, and the semiconductor die has an outer perimeter. The packaged semiconductor devices can further include a conductive wall, an encapsulant, and a conductive cap. The conductive wall is on the first side of the redistribution structure and is spaced laterally apart from the outer perimeter of the semiconductor die. The conductive wall is electrically coupled to the shield contact, and the conductive wall extends around at least a portion of the outer perimeter of the semiconductor die. The encapsulant covers at least a portion of the semiconductor die and extends laterally outward with respect to the outer perimeter of the semiconductor die. The conductive cap is attached to the encapsulant and is electrically coupled to the conductive wall. The conductive wall and the conductive cap form a shield structure configured to protect the semiconductor die from electromagnetic interference.

Figure 1A:
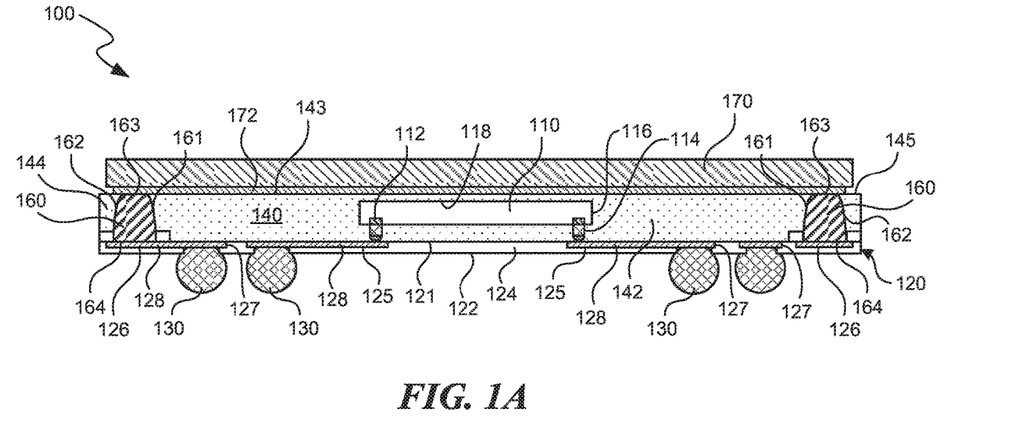
FIG. 1A is a cross-sectional view of a packaged semiconductor device in accordance with embodiments of the present technology.
Figure 1B:
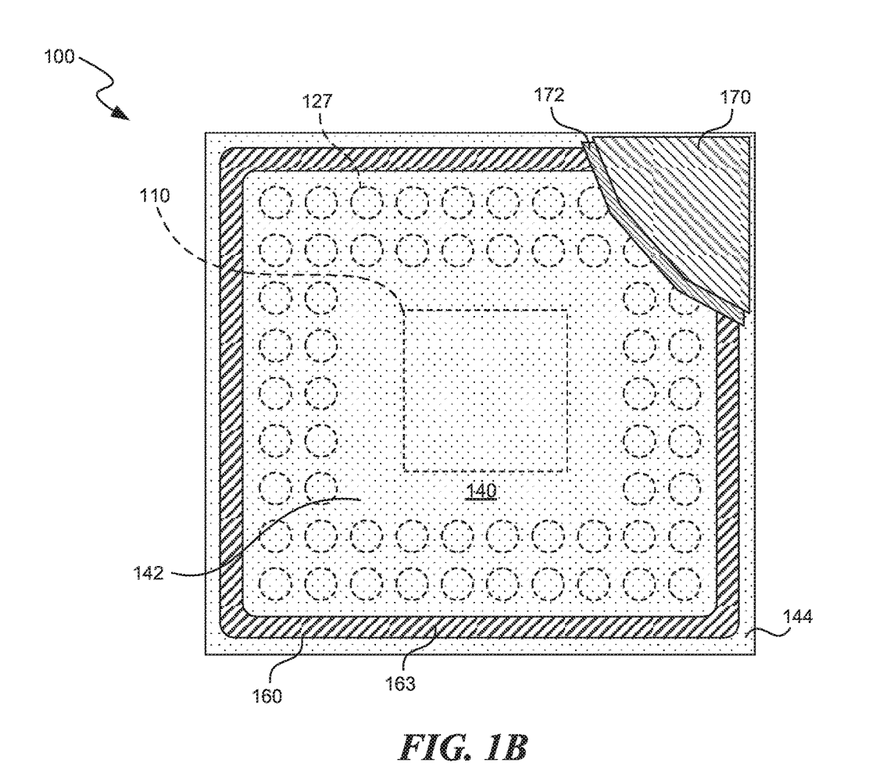
FIG. 1B is a top plan view of the packaged semiconductor device of FIG. 1A with various layers cutaway for clarity.

FIG. 1A is a cross-sectional view of a packaged semiconductor device 100 ("device 100") in accordance with embodiments of the present technology, and FIG. 1B is a top plan view of the device 100 of FIG. 1A with various layers cutaway for clarity. Referring to FIG. 1A, the device 100 includes a semiconductor die 110, a redistribution structure (RDS) 120 supporting the semiconductor die 110, and an encapsulant 140 covering at least a portion of the semiconductor die 110 and extending laterally across a surface of the RDS 120. The device 100 further includes a conductive wall 160 and a conductive cap 170 electrically coupled to the conductive wall 160. The conductive wall 160 is electrically coupled to a ground contact such that the conductive wall 160 and the conductive cap 170 collectively define a shield structure configured to protect the semiconductor die 110 from electromagnetic interference.

The semiconductor die 110 can include semiconductor materials, conductive materials, and dielectric materials arranged to form integrated circuits or components, data storage elements, processing components, and/or other features manufactured on semiconductor substrates. For example, the semiconductor die 110 can include integrated memory circuitry and/or logic circuitry, which can include various types of semiconductor components and functional features, such as dynamic random-access memory (DRAM), static random-access memory (SRAM), flash memory, other forms of integrated circuit memory, processing circuits, imaging components, and/or other semiconductor features. The semiconductor die 110 can further include bond pads 112 electrically coupled to the integrated circuitry and conductive bumps 114 attached to the bond pads 112. In some embodiments, the device 100 can include a plurality of semiconductor dies that can be identical (e.g., memory dies manufactured to have the same design and specifications) or different from each other (e.g., different types of memory dies or a combination of controller, logic and/or memory dies).

The RDS 120 has a first side 121, a second side 122, and a dielectric formation 124 having a thickness from the first side 121 to the second side 122. The RDS 120 further includes die contacts 125 at the first side 121, at least one shield contact 126 at the first side 121, ball pads 127 at the second side 122, and conductive lines 128 electrically coupling the ball pads 127 to the die contacts 125 and the shield contacts 126. In the illustrated embodiment, the die contacts 125 and the corresponding ball pads 127 can be at opposing ends of corresponding conductive lines 128. Similarly, the shield contacts 126 and the corresponding ball pads 127 can be at opposing ends of corresponding conductive lines 128. In the embodiment illustrated in FIG. 1A, individual bond pads 112 of the semiconductor die 110 are electrically coupled to a corresponding one of the die contacts 125 via the conductive bumps 114.

The encapsulant 140 has a first portion 142 within the conductive wall 160 that covers at least a portion of the semiconductor die 110 and a second portion 144 outside of the conductive wall 160. The first portion 142 of the encapsulant 140 can extend laterally outward with respect to an outer perimeter 116 of the semiconductor die to an inner surface 161 of the conductive wall 160. The first portion 142 can include an upper surface 143 that completely covers a backside 118 of the semiconductor die 110, and the first portion 142 of the encapsulant 140 can also fill a gap between the semiconductor die 110 and the RDS 120. Alternatively, the gap between the semiconductor die 110 and the RDS 120 can be filled by an underfill material. The second portion 144 of the encapsulant 140 can extend laterally outward from an outer surface 162 of the conductive wall 160. The second portion 144 of the encapsulant 140 can have an upper surface 145 that is coplanar with the upper surface 143 of the first portion 142 of the encapsulant 140. The first portion 142 and the second portion 144 of the encapsulant 140 can be made from the same material, or alternatively the first and second portions 142 and 144 can be different materials.

The encapsulant 140 can be a sealing resin that is deposited onto the RDS 120 using a nozzle or other type of deposition technique. Alternatively, the encapsulant 140 can be molded onto the RDS 120 and around the semiconductor die 110 using injection molding or other molding techniques.

The conductive wall 160 can be a sidewall formed on the first side 121 of the RDS 120 such that at least a portion of the conductive wall 160 contacts one or more of the shield contacts 126 of the RDS 120. Referring to FIGS. 1A and 1B together, the conductive wall 160 can be formed by depositing silver, solder, copper, or other suitable conductive materials such that the conductive wall 160 extends around at least a portion of the outer perimeter 116 of the semiconductor die 110. Referring to FIG. 1B, the conductive wall 160 can extend completely around the perimeter 116 of the semiconductor die 110, but in other embodiments the conductive wall 160 can have discrete segments separated from each other by gaps. For example, the conductive wall 160 can have four segments in which each segment is spaced laterally outward from a corresponding side of the outer perimeter 116, or in other embodiments the conductive wall 160 can have two L-shaped segments, etc. The conductive wall 160 can have a top surface 163 that is co-planar with the upper surface 143 of the encapsulant 140, and a bottom surface 164 that is electrically coupled to one or more of the shield contacts 126. The bottom surface 164 of the conductive wall 160 can rest either on the shield contacts 126 and/or the upper surface of the dielectric formation 124. In either case, the conductive wall 160 is electrically coupled to a solder ball 130 or other electrical connector on the second side 122 of the RDS 120.

The conductive cap 170 can be attached to the upper surface 143 of the encapsulant 140 and the top surface 163 of the conductive wall 160 by a conductive adhesive 172. The conductive cap 170 can completely cover the area within the conductive wall 160. For example, the conductive cap 170 can cover the first portion 142 of the encapsulant 140, including the portion of the encapsulant 140 over the backside 118 of the semiconductor die 110, and at least a portion of the top surface 163 of the conductive wall 160. In other embodiments, the conductive cap 170 can have an opening, slot, channel or other type of void such that the conductive cap 170 does not completely cover the region within the conductive wall 160. The conductive cap 170 can be a copper panel that is preformed and attached to the first portion 142 of the encapsulant 140 and the conductive wall 160 using the conductive adhesive 172. In other embodiments, the conductive cap 170 can be one or more layers of conductive material that are otherwise disposed on the encapsulant 140 and the conductive wall 160.

In operation, the conductive wall 160 and the conductive cap 170 can be electrically coupled to ground via the corresponding solder ball 130 on the second side 122 of the RDS 120. The conductive wall 160 and the conductive cap 170 together form a shield structure configured to shield the semiconductor die 110 from electromagnetic interference. One advantage of embodiments of the present technology is that the shield structure can be formed at the wafer level or panel level because the individual conductive walls 160 for individual packaged devices 100 can be formed for several different devices using known techniques for wafer-level or panel-level processing. Similarly, the conductive caps 170 can be mounted to the corresponding devices 100 using known wafer-level or panel-level processing techniques. As a result, the present technology is expected to efficiently produce shielded packaged semiconductor devices.

FIGS. 2A-2H are cross-sectional views illustrating various stages of methods for forming embodiments of the device 100 of FIG. 1A using wafer-level or panel-level manufacturing techniques. More specifically, a complete device 100 is illustrated being formed in the middle and portions of two additional devices are illustrated being formed to the left and right of the complete device. Although only a single complete device 100 is shown in FIGS. 2A-2H, it will be appreciated that a plurality of devices can be packaged concurrently using wafer-level or panel-level processing.

Figure 2A:
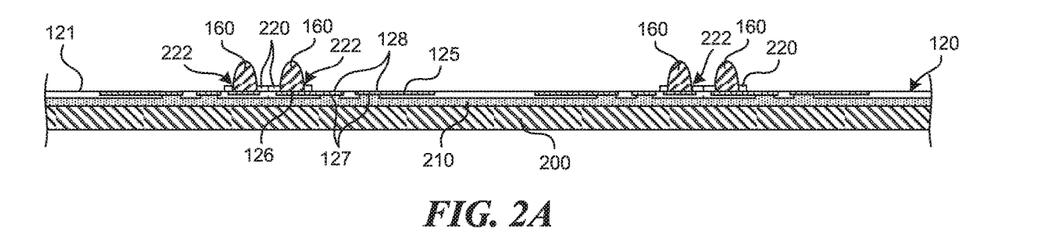
FIGS. 2A-2H are cross-sectional views of various stages of a method for forming packaged semiconductor devices in accordance with embodiments of the present technology.

FIG. 2A shows a stage of the method after (a) RDSs 120 have been formed and attached to a carrier 200 and (b) conductive walls 160 have been formed on the first side 121 of the RDSs 120. The carrier 200 provides mechanical support for subsequent processing stages and can be a temporary carrier formed from, e.g., silicon, silicon-on-insulator, compound semiconductors (e.g., Gallium Nitride), glass or other suitable materials. In some embodiments, the carrier 200 is covered with a release layer 210 such that the carrier 200 can be reused after the packaged devices have been removed from the release layer 210. The release layer 210 prevents direct contact of the RDSs 120 with the carrier 200 to protect the RDSs 120 from contamination or physical damage. The release layer 210 can be a disposable film (e.g., a laminate film of epoxy-based material) or other suitable material. In some embodiments, the release layer 210 is a laser-sensitive or photo-sensitive material that facilitates removal at a subsequent stage.

The conductive walls 160 can be formed by disposing a conductive material on the first side 121 of the RDS 120. At least a portion of the conductive material contacts at least one of the shield contacts 126. In one embodiment, a foundation 220 is first deposited on the first side 121 of the RDS 120 and openings 222 are formed in the foundation 220. The conductive material is then deposited in the openings 222 and across the first side 121 of the RDS 120 to form the conductive walls 160. The conductive material of the conductive wall 160 can be a conductive paste, such as a silver paste or solder paste. The conductive paste can optionally be re-flowed such that the surface tension of the re-flowed paste causes the conductive material to stay within the openings 222 and project away from the first surface 121 of the RDS 120. In other embodiments, the conductive walls 160 can be formed by three dimensionally printing a conductive material on the first surface 121 of the RDS 120 and over the shield contacts 126. In still additional embodiments, the conductive walls can be formed by electroplating, electro-less plating, vapor deposition techniques, and/or other metallization techniques.

Figure 2B:
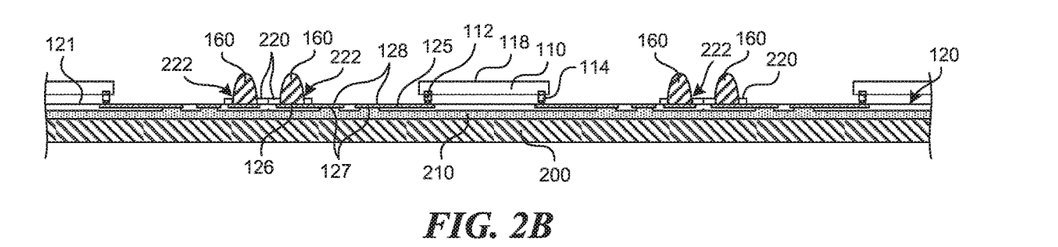
Figure 2C:
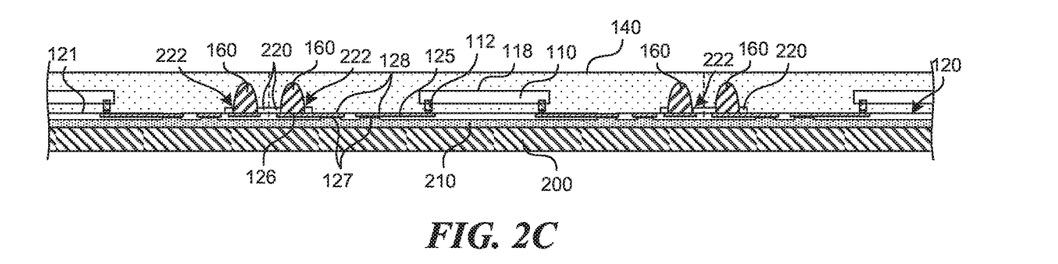
Figure 2D:
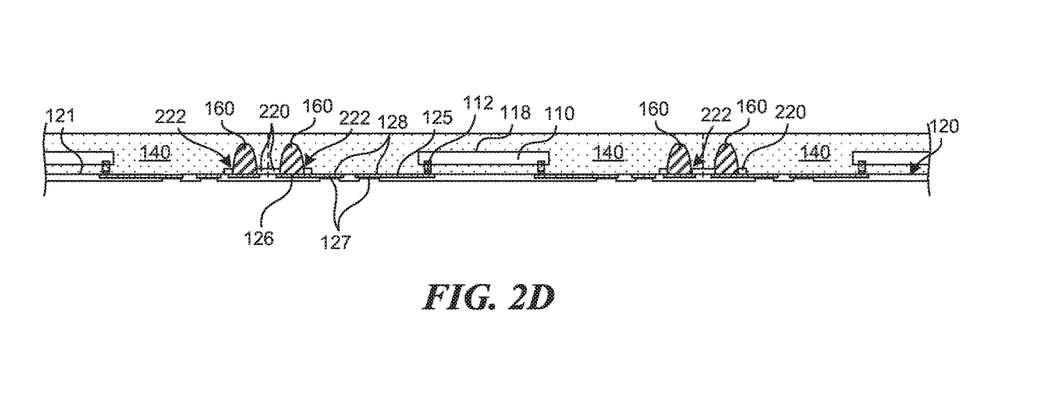

FIGS. 2B-2E illustrate subsequent stages after the semiconductor dies 110 have been mounted to the RDSs 120 and the encapsulant 140 has been disposed over the semiconductor dies 110. FIG. 2B, more specifically, illustrates mounting the semiconductor dies 110 to the first side 121 of the RDSs 120 such that the bond pads 112 of the semiconductor dies 110 are electrically coupled to the die pads 125 of the RDSs 120 via the conductive bumps 114. FIG. 2C illustrates the method after the material of the encapsulant 140 has been disposed over the semiconductor dies 110 and the conductive walls 160. The encapsulant 140 can be disposed using injection molding techniques, other molding techniques, or by flowing the material of the encapsulant 140 across the front side 121 of the RDSs 120 using a dam around the perimeter of the wafer or panel. The encapsulant 140 can be configured to completely cover the conductive walls 160 as well as the semiconductor dies 110. In the illustrated embodiment, the encapsulant 140 can also fill the gaps between the semiconductor dies 110 and the first surface 121 of the RDSs 120, or the gaps can be filled by a separate underfill material. FIG. 2D illustrates the method after the encapsulant 140 has sufficiently cured to provide structural integrity for the semiconductor dies 110 and the carrier 200 has been removed.

Figure 2E:
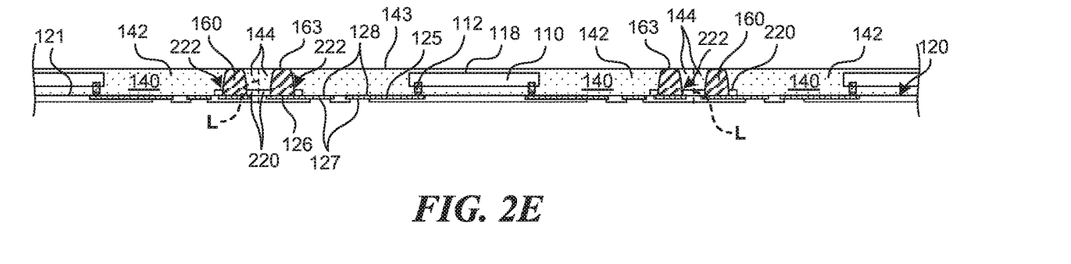

FIG. 2E illustrates the method after the upper surfaces 143 of the encapsulant 140 and the top surfaces 163 of the conductive lines 160 have been formed. The upper surfaces 143 and the top surfaces 163 can be formed by grinding, chemical mechanical polishing, etching, or other suitable techniques for removing the upper portions of the encapsulant 140 and the upper portions of the conductive material of the conductive walls 160. In the illustrated embodiment, the upper portion of the material of the encapsulant 140 and the upper portions of the conductive walls 160 shown in FIG. 2D have been ground to form the exposed top surfaces 163 of the conductive walls 160 while leaving a portion of the encapsulant 140 over the backsides 118 of the semiconductor dies 110. As a result, the upper surfaces 143 of the encapsulant 140 and the top surfaces 163 of the conductive walls 160 are coplanar with each other. In other embodiments, the elevation of the upper surfaces 143 of the encapsulant 140 and the top surfaces 163 of the conductive lines 160 can be coplanar with the backsides 118 of the semiconductor dies 110. The formation of the top surfaces 163 of the conductive walls 160 at this stage of the method further forms (a) the first portions 142 of the encapsulant 140 in the regions between the conductive walls 160 where the semiconductor dies 110 are located and (b) the second portions 144 of the encapsulant 140 in the regions between the conductive walls 160 where the dicing lanes "L" are located.

Figure 2F:
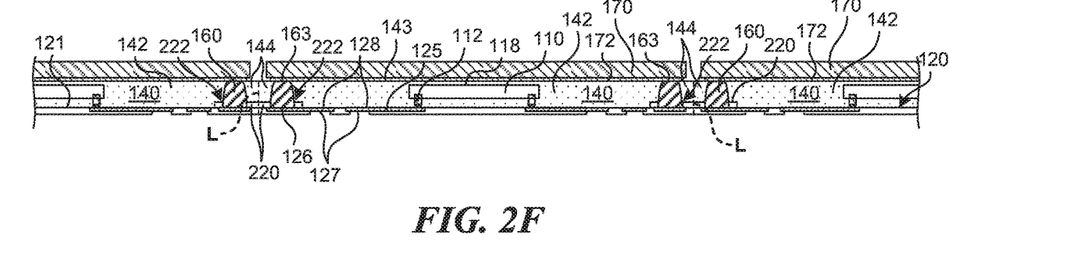

FIG. 2F illustrates a stage of the method after the conductive caps 170 have been attached to the upper surfaces 143 of the encapsulant 140 and the top surfaces 163 of the conductive walls 160. The conductive caps 170 can be attached to the top surfaces 163 of the conductive walls 160 using a conductive adhesive 172. In the illustrated embodiment, the conductive caps 170 are also attached to the upper surfaces 143 of the first portions 142 of the encapsulant 140 over the semiconductor dies 110. In embodiments in which the upper surfaces 143 of the encapsulant 140 are coplanar with the backsides 118 of the semiconductor dies 110, the conductive caps 170 can be attached directly to the backsides 118 of the semiconductor dies 110 to enhance dissipation of heat from the semiconductor dies 110. The conductive caps 170 and the corresponding conductive walls 160 to which they are attached together form shield structures for protecting the semiconductor dies 110 from electromagnetic interference.

Figure 2G:
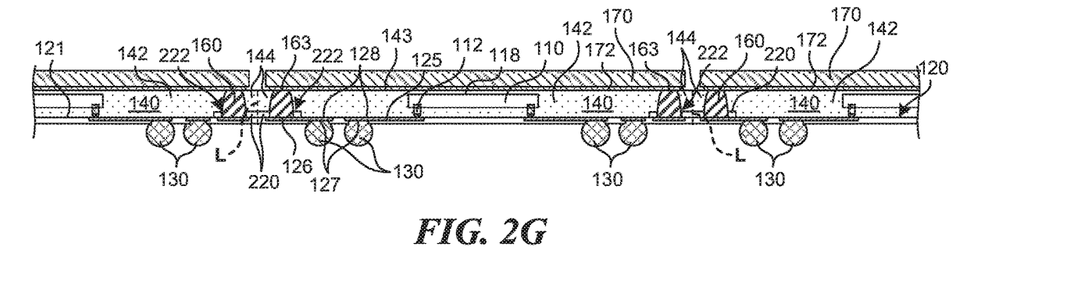
Figure 2H:
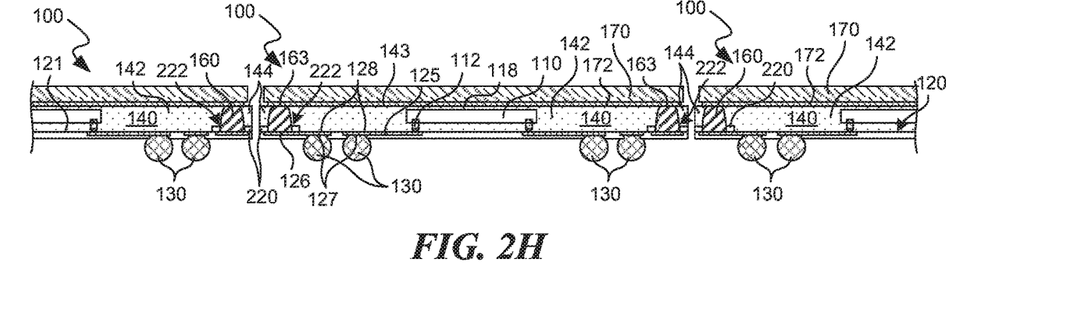

FIG. 2G illustrates a stage after solder balls 130 have been deposited on the ball pads 127 of the RDSs 120. FIG. 2H illustrates forming the individual devices 100 by cutting through the second portions 144 of the encapsulant 140 along the dicing lanes "L".

Figure 3A:
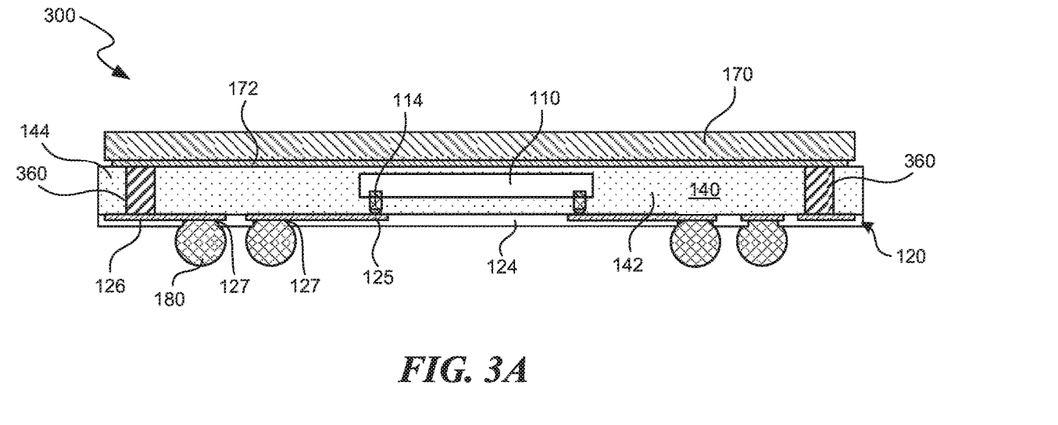
FIG. 3A is a cross-sectional view of a packaged semiconductor device in accordance with embodiments of the present technology.
Figure 3B:
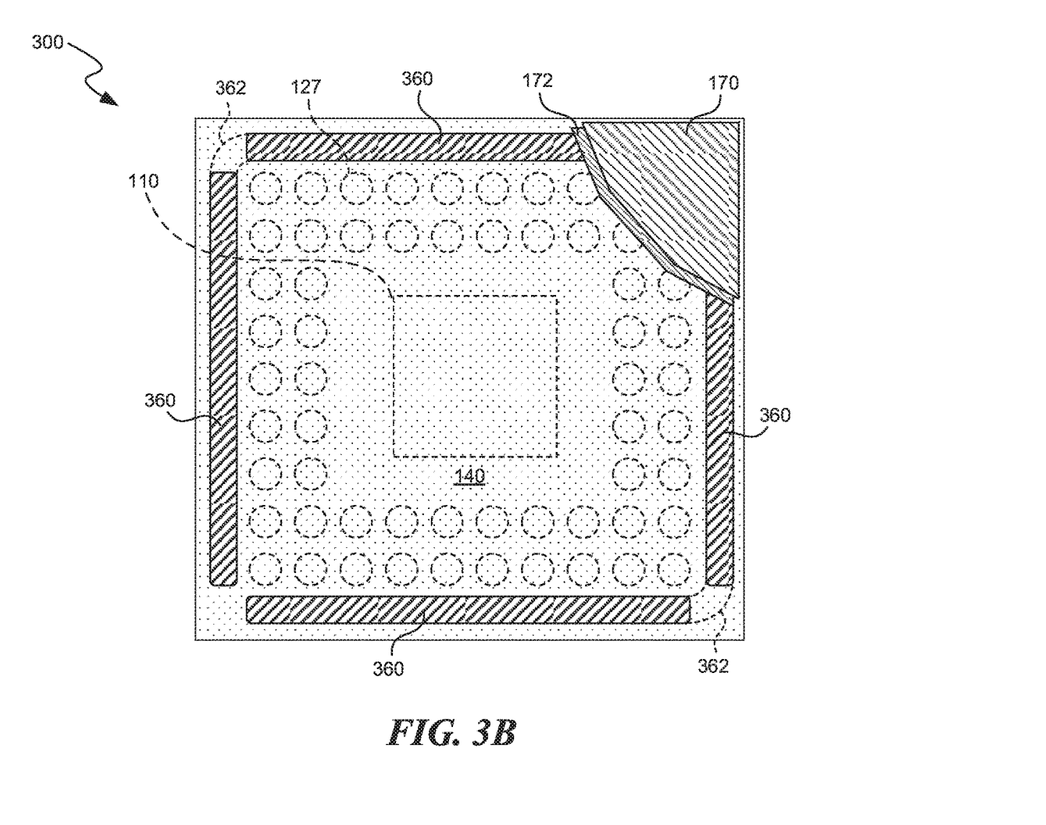
FIG. 3B is a top plan view of the packaged semiconductor device of FIG. 3A with various layers cutaway for clarity.

FIG. 3A is a cross-sectional view of a packaged semiconductor device 300 ("device 300") in accordance with embodiments of the present technology, and FIG. 3B is a top plan view of the device 300 of FIG. 3A with various layers cutaway for clarity. Referring to FIG. 3A, the device 300 includes a conductive wall 360 formed by electroplating or other metallization technique. In this example, the semiconductor die 110 is attached to the RDS 120 and the material of the encapsulant 140 is disposed over the semiconductor die 110 and the RDS 120 before forming the conductive wall 360. After the encapsulant 140 has been disposed, openings are formed through the encapsulant 140 such that the openings through the encapsulant 140 are aligned with the shield contacts 126. A conductive material can then be plated into the openings using the shield contacts 126. For example, a seed layer of copper or other suitable conductive material can be deposited into the openings using sputtering or chemical vapor deposition techniques, and then copper or another suitable conductive material can be plated into the openings using electroplating or electro-less plating techniques.

FIG. 3B illustrates an embodiment in which the conductive wall 360 has four separate segments in which each segment is spaced apart from a corresponding edge of the semiconductor die 110. Alternatively, other embodiments can include two L-shaped segments that have corners 362 (shown in dashed lines) of conductive material between two straight segments. It will be appreciated that the conductive wall can have fewer or more gaps between individual segments than those shown in FIGS. 1B and 3B.

Figure 4:
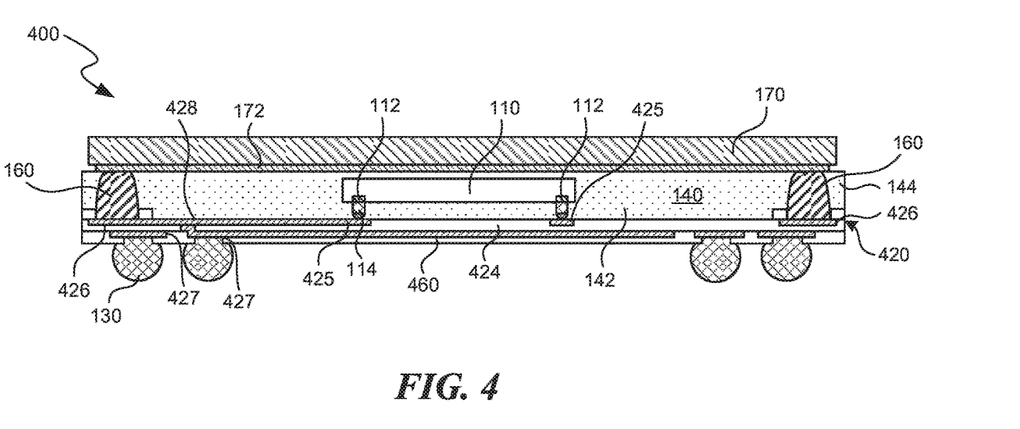
FIG. 4 is a cross-sectional view of a packaged semiconductor device in accordance with embodiments of the present technology.

FIG. 4 is a cross-sectional view of a packaged semiconductor device 400 ("device 400") in accordance with embodiments of the present technology. The device 400 is similar to the device 100 described above except that the device 400 includes a multi-level redistribution structure (RDS) 420 that includes a dielectric formation 424 and multiple conductive layers. The RDS 420, for example, has a first conductive level including die contacts 425 and shield contacts 426, and a second conductive level including a shield component 460 and ball pads 427. In the embodiment illustrated in FIG. 4, the shield component 460 is electrically coupled to a conductive line 428 at the first conductive level such that the shield component 460, a bond pad 112 of the semiconductor die 110 (e.g., the leftmost bond pad 112), the conductive wall 160, and the conductive cap 170 are all electrically coupled to each other. As a result, the shield component 460, conductive wall 160, and conductive cap 170 together form a shield structure to protect the semiconductor die 110 from electric magnetic interference.

Figure 5:
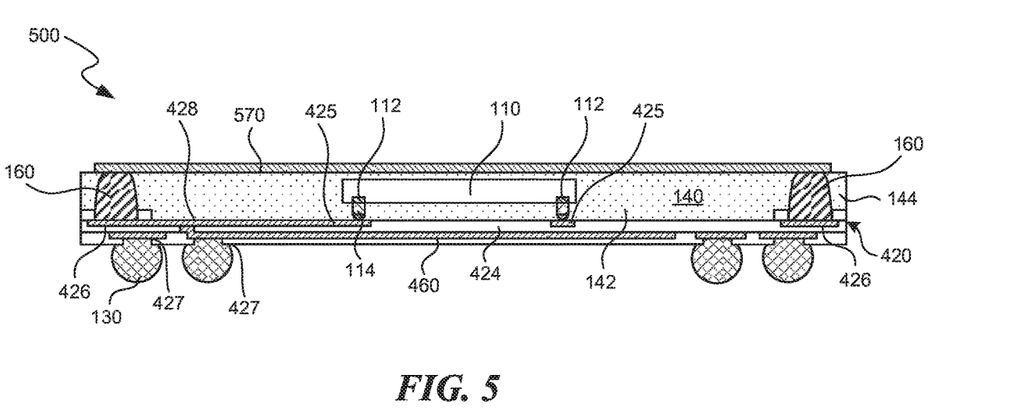
FIG. 5 is a cross-sectional view of a packaged semiconductor device in accordance with embodiments of the present technology.

FIG. 5 is a cross-sectional view of a packaged semiconductor device 500 ("device 500") in accordance with embodiments of the present technology. The device 500 is similar to the device 400, but the device 500 includes a conductive cap 570 formed on the upper surface 143 of the encapsulant 140 and the top surfaces 163 of the conductive wall 160 as opposed to being a pre-formed conductive panel that is attached to the encapsulant 140 and the conductive wall 160. For example, the conductive cap 570 can be formed on the encapsulant 140 and the conductive wall 160 by depositing copper or other suitable conductive materials using electroplating, electro-less plating, vapor deposition, or other suitable techniques for depositing metals. This embodiment accordingly eliminates the need for a pre-formed metal cap and an adhesive.

Figure 6:
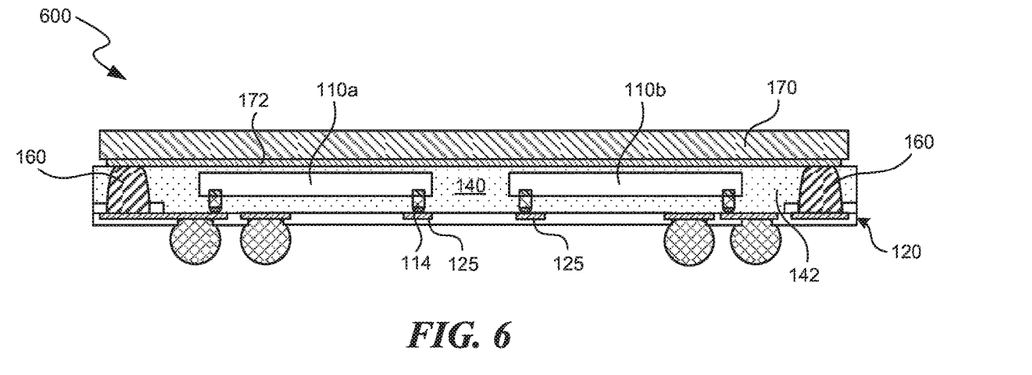
FIG. 6 is a cross-sectional view of a packaged semiconductor device in accordance with embodiments of the present technology.
Figure 7:
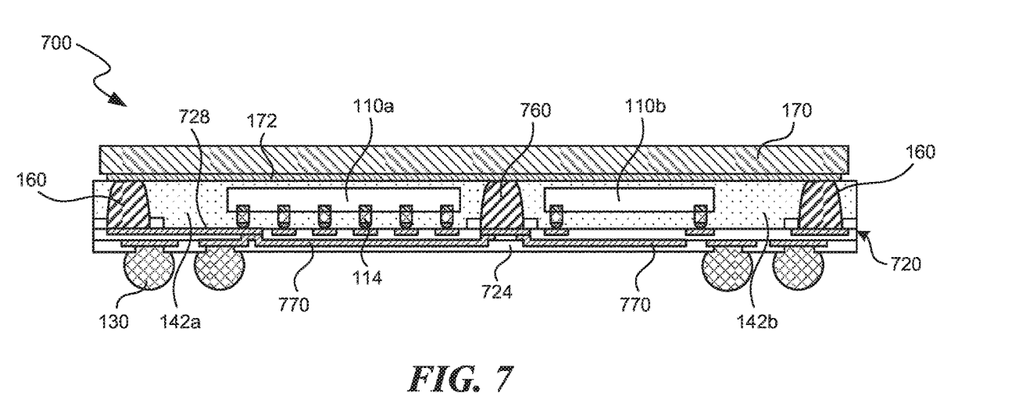
FIG. 7 is a cross-sectional view of a packaged semiconductor device in accordance with embodiments of the present technology.
Figure 8:
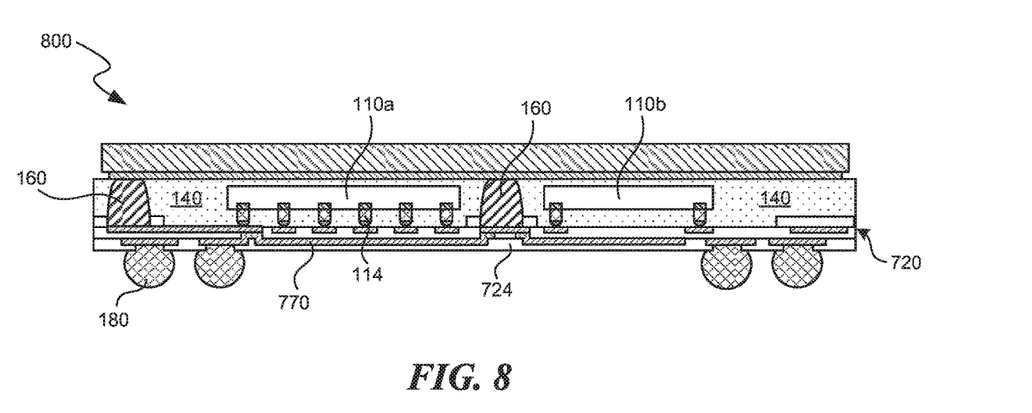
FIG. 8 is a cross-sectional view of a packaged semiconductor device in accordance with embodiments of the present technology.

FIGS. 6-8 are cross-sectional views of packaged semiconductor devices 600, 700 and 800, respectively, that have multiple semiconductor dies. Like reference numbers refer to similar or even identical components in FIGS. 1A-8. Each of the devices 600, 700 and 800 includes at least a first semiconductor die 110a and a second semiconductor die 110b (collectively "first and second dies 110a-b"). The first and second dies 110a-b can be the same as each other, or they can be different types of dies. For example the first and second dies 110a-b can be the same or similar types of memory dies, or the first semiconductor die 110a can be a memory die and the second semiconductor die 110b can be a logic die or a processor die.

Referring to FIG. 6, the semiconductor device 600 ("device 600") has the RDS 120, the conductive wall 160, and the top cap 170 as described above with respect to the device 100. In this embodiment, both of the first and second dies 110a-b are in a common portion of the encapsulant 140. As with the device 100, the conductive cap 170 and the conductive wall 160 are electrically coupled together and form a shield to protect the first and second dies 110a-b from electromagnetic interference.

Referring to FIG. 7, the semiconductor device 700 ("device 700") has the conductive wall 160 near the outer perimeter of the device 700 and an inner conductive partition 760 that divides the first portion of the encapsulant 140 into a first section 742a and a second section 742b within the conductive wall 160. The device 700 also includes a multi-level RDS 720 that includes shield components 770. The inner conductive partition 760 can be electrically coupled to the shield components 770, and at least one of the shield components 770 can be electrically coupled to the conductive wall 160 and the top cap 170. As such, the inner conductive partition 760, the shield components 770, the conductive wall 160, and the top cap 170 can form shield structures around each of the first and second dies 110a-b to protect the first and second dies 110a-b from electromagnetic interference.

Referring to FIG. 8, the semiconductor device 800 ("device 800") is similar to the device 700 but only the first semiconductor die 110a is fully shielded. More specifically, the conductive wall 160 extends around only the first semiconductor die 110a but not the complete outer perimeter portion of the device 800. The second semiconductor die 110b is not shielded on one side.

Figure 9:
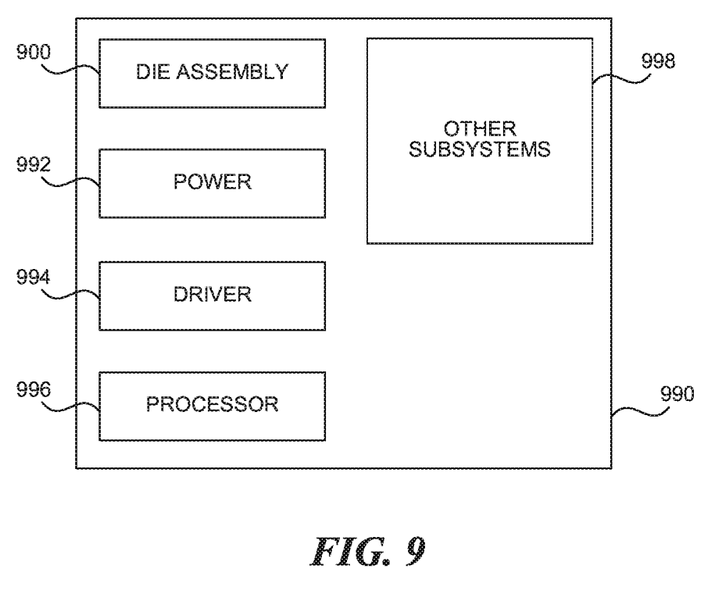
FIG. 9 is a schematic view of a system that includes a semiconductor device configured in accordance with embodiments of the present technology.

Any one of the semiconductor devices described above with reference to FIGS. 1A-8 can be incorporated into any of a myriad of larger and/or more complex systems, a representative example of which is system 990 shown schematically in FIG. 9. The system 990 can include a semiconductor die assembly 900, a power source 992, a driver 994, a processor 996, and/or other subsystems or components 998. The semiconductor die assembly 900 can include semiconductor devices with features generally similar to those of the semiconductor devices described above. The resulting system 990 can perform any of a wide variety of functions, such as memory storage, data processing, and/or other suitable functions. Accordingly, representative systems 990 can include, without limitation, hand-held devices (e.g., mobile phones, tablets, digital readers, and digital audio players), computers, and appliances. Components of the system 990 may be housed in a single unit or distributed over multiple, interconnected units (e.g., through a communications network). The components of the system 990 can also include remote devices and any of a wide variety of computer readable media.

From the foregoing, it will be appreciated that specific embodiments of the invention have been described herein for purposes of illustration, but that various modifications may be made without deviating from the scope of the invention. Accordingly, the invention is not limited except as by the appended claims.

We claim:

1. A method of packaging a semiconductor device, comprising:
   electrically coupling a semiconductor die to die contacts at a first side of a redistribution structure, wherein
      the die contacts are electrically coupled to ball pads at a second side of the redistribution structure, and
      the redistribution structure includes (1) a dielectric formation defining the first and second sides and (2) conductive metal;
   forming a singular conductive wall around the semiconductor die by depositing a conductive material onto the redistribution structure using a single implementation of a metallization deposition technique that forms the conductive wall on the redistribution structure, wherein the conductive wall is electrically coupled to at least one shield contact at the first side of the redistribution structure, and wherein the shield contact is electrically coupled to a ball pad at the second side of the redistribution structure;
   depositing an encapsulant over the semiconductor die, wherein the encapsulant has an upper surface;
   removing a portion of the encapsulant and a portion of the conductive wall to form the upper surface on the encapsulant over the semiconductor die and a top surface on the conductive wall, wherein the upper surface of the encapsulant and the top surface of the conductive wall are coplanar; and
   disposing a conductive cap onto the upper surface of the encapsulant, wherein the conductive cap is electrically coupled to the conductive wall.

2. The method of claim 1 wherein depositing the encapsulant comprises covering a backside of the semiconductor die with the encapsulant.

3. The method of claim 2 wherein disposing the conductive cap onto the upper surface of the encapsulant comprises adhering a metal plate to the upper surface of the encapsulant and the top surface of the conductive wall.

4. The method of claim 2 wherein disposing the conductive cap onto the upper surface of the encapsulant comprises depositing at least one layer of a conductive material onto the surface of the encapsulant and directly onto the top surface of the conductive wall.

5. The method of claim 2 wherein the redistribution structure comprises a multi-level shield structure, and wherein the method further comprises forming a shield component in the multi-level shield structure that is electrically coupled to the conductive wall and the conductive cap.

6. The method of claim 1 wherein:
   the dielectric formation has a first dimension along a first direction; and
   the singular conductive wall has a length along the first direction, wherein the length is at least half of the first dimension.

7. The method of claim 6 further comprising:
   forming a second wall opposite the continuous conductive wall across the semiconductor device, wherein the continuous conductive wall comprises a first wall;
   forming a third wall extending between the first and second walls; and
   forming a fourth wall extending between the first and second walls, wherein the fourth wall is opposite the third wall across the semiconductor device;
   wherein
   the second, third, and fourth wall are formed simultaneously with the first wall by depositing the conductive material onto the redistribution structure using the metallization deposition technique.

8. The method of claim 7, wherein the first, second, third, and fourth walls are physically spaced apart from each other.

9. The method of claim 1 wherein the conductive cap fully overlaps the semiconductor die.

10. The method of claim 9 wherein the conductive cap extends past opposing perimeter edges of the semiconductor die.

11. The method of claim 1 wherein the singular conductive wall continuously encircles an outer perimeter of the semiconductor die.

12. A method of packaging a semiconductor device, comprising:
   electrically coupling a semiconductor die to die contacts at a first side of a redistribution structure, wherein
      the die contacts are electrically coupled to ball pads at a second side of the redistribution structure, and
      the redistribution structure includes (1) a dielectric formation defining the first and second sides and (2) conductive metal;
   forming a singular conductive wall around the semiconductor die by depositing a conductive material onto the redistribution structure using a single implementation of a metallization deposition technique that forms the conductive wall on the redistribution structure, wherein the conductive wall is electrically coupled to at least one shield contact at the first side of the redistribution structure, and wherein the shield contact is electrically coupled to a ball pad at the second side of the redistribution structure;

depositing an encapsulant over the semiconductor die and the conductive wall, wherein the encapsulant is deposited after forming the conductive wall and has an upper surface;

removing a portion of the encapsulant and a portion of the conductive wall to form the upper surface on the encapsulant over the semiconductor die and a top surface on the conductive wall, wherein the upper surface of the encapsulant and the top surface of the conductive wall are coplanar; and disposing a conductive cap onto the upper surface of the encapsulant, wherein the conductive cap is electrically coupled to the conductive wall.

13. The method of claim 12 wherein depositing the encapsulant comprises covering a backside of the semiconductor die with the encapsulant.

14. The method of claim 12 wherein disposing the conductive cap onto the upper surface of the encapsulant comprises adhering a metal plate to the upper surface of the encapsulant and the top surface of the conductive wall.

15. The method of claim 12 wherein disposing the conductive cap onto the upper surface of the encapsulant comprises depositing at least one layer of a conductive material onto the surface of the encapsulant and directly onto the top surface of the conductive wall.

16. The method of claim 12 wherein the redistribution structure comprises a multi-level shield structure, and wherein the method further comprises forming a shield component in the multi-level shield structure that is electrically coupled to the conductive wall and the conductive cap.

* * * * *